United States Patent [19]

Hsu et al.

[11] Patent Number: 5,460,993

[45] Date of Patent: Oct. 24, 1995

[54] METHOD OF MAKING NMOS AND PMOS LDD TRANSISTORS UTILIZING THINNED SIDEWALL SPACERS

[75] Inventors: Shun-Liang Hsu, Hsin-Chu; Shyh-Chyi Wong, Taichung, both of Taiwan

[73] Assignee: Taiwan Semiconductor Manufacturing Company Ltd., Hsinchu, Taiwan

[21] Appl. No.: 415,321

[22] Filed: Apr. 3, 1995

[51] Int. Cl.$^6$ .................. H01L 21/8232; H01L 21/8234; H01L 21/8238
[52] U.S. Cl. .................. 437/44; 437/56; 437/57
[58] Field of Search .................. 437/34, 44, 56, 437/57, 58

[56] References Cited

U.S. PATENT DOCUMENTS

| 4,642,878 | 2/1987 | Maeda . | |
|---|---|---|---|
| 4,760,033 | 7/1988 | Mueller | 437/34 |
| 5,091,763 | 2/1992 | Sanchez | 357/23.9 |
| 5,296,401 | 3/1994 | Mitsui et al. | 437/57 |

FOREIGN PATENT DOCUMENTS

| 0240781 | 10/1987 | European Pat. Off. | 437/44 |
|---|---|---|---|
| 0403368 | 12/1990 | European Pat. Off. | 437/44 |
| 0269944 | 7/1989 | Germany | 437/57 |
| 402122648 | 5/1990 | Japan | 437/44 |

OTHER PUBLICATIONS

"High Drivability and High Reliability MOSFETs with Non-Doped Poly-Sispacer LDD Structure" by A. Shimizu et al. Symposium of VLSI Tech. 1992, pp. 90–91.

"Double Spacer Technique for Titanium Self-Aligned Silicidation Technology," by W. D. Su et al, Symposium of VLSI Technology, pp. 113–116.

*Primary Examiner*—Olik Chaudhuri
*Assistant Examiner*—Richard A. Booth
*Attorney, Agent, or Firm*—George O. Saile; Rosemary L. S. Pike

[57] ABSTRACT

A method of forming different width spacers for NMOS and PMOS in the fabrication of an integrated circuit is described. A semiconductor substrate is provided wherein NMOS and PMOS regions are separated by an isolation region. Gate electrodes are formed in the NMOS and PMOS regions. Lightly doped regions are implanted into the semiconductor substrate within the NMOS and PMOS regions. A spacer material layer is deposited over the gate electrodes in the NMOS and PMOS regions and etched away to leave spacers on the sidewalls of the gate electrodes. The NMOS region is covered with a photoresist mask. Heavily doped source and drain regions are implanted into the semiconductor substrate within the PMOS region. The photoresist mask is removed. After the PMOS implantation, a portion of the spacers is etched away to leave narrower spacers on the sidewalls of the gate electrodes. The PMOS region is covered with a photoresist mask. Heavily doped source and drain regions are implanted into the semiconductor substrate within the NMOS region. The photoresist mask is removed and the fabrication of the integrated circuit is completed.

24 Claims, 1 Drawing Sheet

METHOD OF MAKING NMOS AND PMOS LDD TRANSISTORS UTILIZING THINNED SIDEWALL SPACERS

BACKGROUND OF THE INVENTION (1) Field of the Invention

The invention relates to the fabrication of integrated circuit devices, and more particularly, to a method of adjusting NMOS spacer width after PMOS formation to achieve reliable devices in the manufacture of integrated circuits.

(2) Description of the Prior Art

The requirements of shorter spacer width for NMOS devices and longer spacer width for PMOS devices becomes important for deep-submicron devices. As a result, NMOS devices can provide a higher driving current and PMOS devices can have a wider process margin. Some workers in the field have used double or differential spacer techniques in LDD structure. The material used for the double spacer may be polysilicon, as taught in the paper, "High Drivability and High Reliability MOSFETs with Non-Doped Poly-Si Spacer LDD Structure," by A. Shimizu et al, *Symposium of VLSI Technology*, 1992, pp. 90–91, or the material may be an oxide film, as taught in the paper, "Double Spacer Technique for Titanium Self-Aligned Silicidation Technology," by W. D. Su et al, *Symposium of VLSI Technology*, 1991, pp. 113–116. However, these processes are complicated in terms of chemical vapor deposition and cycle time.

U.S. Pat. No. 4,760,033 to Mueller teaches a process of using different N and P MOS spacer widths for reducing the under-diffusion of the implanted source-drain regions under the gate areas. U.S. Pat. No. 5,091,763 to Sanchez discloses the use of a conductive spacer coupled with a thin oxide spacer in order to form self-aligned source and drain regions.

NMOS source/drain implantation is commonly performed prior to PMOS because of the fast diffusion of boron, which is typically used for the PMOS implantation. However, if no thermal processing is performed between the two implantations which would drive in the boron, the NMOS and PMOS implantations can be reversed. Therefore, the NMOS spacer width can be adjusted by etching after PMOS source/drain formation.

SUMMARY OF THE INVENTION

A principal object of the present invention is to provide an effective and very manufacturable method of forming different width spacers for NMOS and PMOS in the fabrication of integrated circuits.

In accordance with the object of this invention a method of forming different width spacers for NMOS and PMOS in the fabrication of an integrated circuit is described. A semiconductor substrate is provided wherein NMOS and PMOS regions are separated by an isolation region. Gate electrodes are formed in the NMOS and PMOS regions. Lightly doped regions are implanted into the semiconductor substrate within the NMOS and PMOS regions. A spacer material layer is deposited over the gate electrodes in the NMOS and PMOS regions and etched away to leave spacers on the sidewalls of the gate electrodes. The NMOS region is covered with a photoresist mask. Heavily doped source and drain regions are implanted into the semiconductor substrate within the PMOS region. The photoresist mask is removed. After the PMOS implantation, a portion of the spacers is etched away to leave narrower spacers on the sidewalls of the gate electrodes. The PMOS region is covered with a photoresist mask. Heavily doped source and drain regions are implanted into the semiconductor substrate within the NMOS region. The photoresist mask is removed and the fabrication of the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
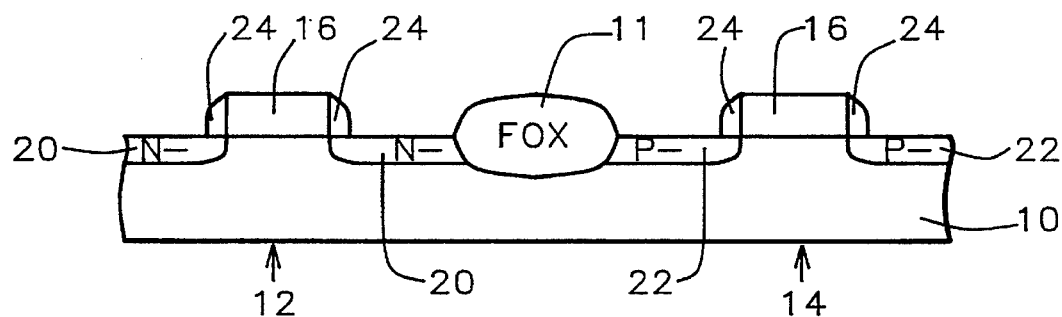
FIGS. 1 through 4 schematically illustrate in cross-sectional representation a preferred embodiment of the present invention.

Referring now more particularly to FIG. 1, there is shown an illustration of a portion of a partially completed integrated circuit. The first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, field oxide region 11 is formed to isolate the NMOS region 12 from the PMOS region 14.

Gate electrodes are formed as is conventional in the art. The surface of the silicon substrate 10 is thermally oxidized to form the gate oxide layer (not shown). The polysilicon layer 16 is deposited, for example, by low pressure chemical vapor deposition (LPCVD). The polysilicon layer is etched as is conventional in the art to provide a desired pattern of gate electrodes within the NMOS 12 and PMOS 14 regions as seen in FIG. 1.

The source/drain structure of the MOS FET may now be formed by the following steps. First, the lightly doped source and drain implantations of N- and P- dopants are performed. Lithographic masks may be required to protect the areas not to be subjected to the particular N- or P- ion implantation. The formation of the lithographic masks is done by conventional lithography and etching techniques. The N-lightly doped drain implantation 20 is done with, for example, phosphorus or arsenic at a dose of between about 8 E 12 to 6 E 13 atoms/cm$^2$ and with an energy of between about 25 to 40 KeV. The P- lightly doped drain implantation 22 is done with, for example, $BF_2$ at a dose of between about 8 E 12 to 6 E 13 atoms/cm$^2$ and with an energy of between about 20 to 40 KeV.

The spacer 24 is now to be formed. The spacer material may be polysilicon or oxide, deposited by LPCVD to a thickness of between about 1500 to 3000 Angstroms. An anisotropic etching of this layer produces the spacers 24 on the sidewalls of the gate electrodes 16. The spacers have a width of between about 1300 to 2500 Angstroms.

The key feature of the present invention will now be described. The PMOS implantation will be performed first with the spacers that have been formed to optimize the PMOS implantation, and then the spacer width will be adjusted so as to optimize the NMOS implantation.

Figure 2:
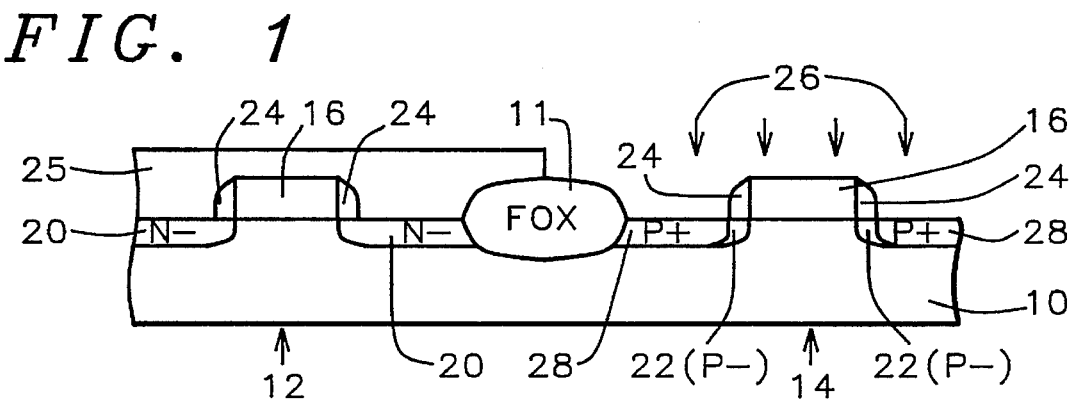

Referring to FIG. 2, the NMOS region 12 is covered by a photoresist mask 25. The P+ heavily doped source and drain implantation 26 is done with, for example, $BF_2$ at a dose of between about 1 E 15 to 3 E 15 atoms/cm$^2$ and with an energy of between about 50 to 70 KeV to form P+ regions 28. The photoresist mask 25 is removed.

Figure 3:
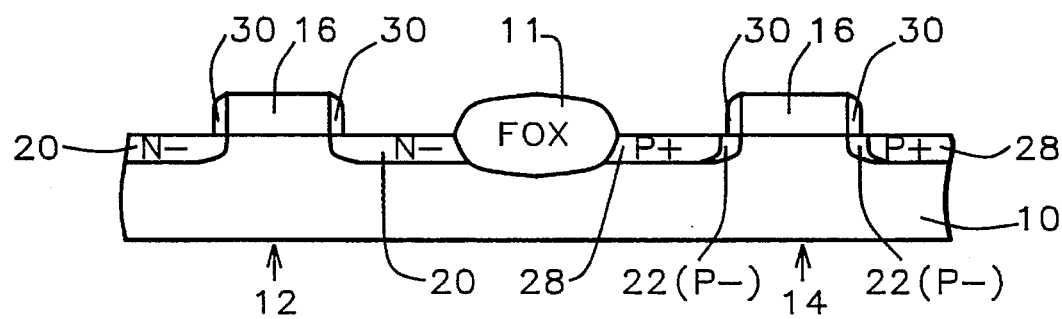

Referring now to FIG. 3, the spacers 24 are etched further resulting in narrower spacers 30 on the sidewalls of the gate electrodes. The etching is usually conducted by a dry etch with a low etch rate. These narrower spacers have a width of between about 1000 to 1700 Angstroms.

Figure 4:
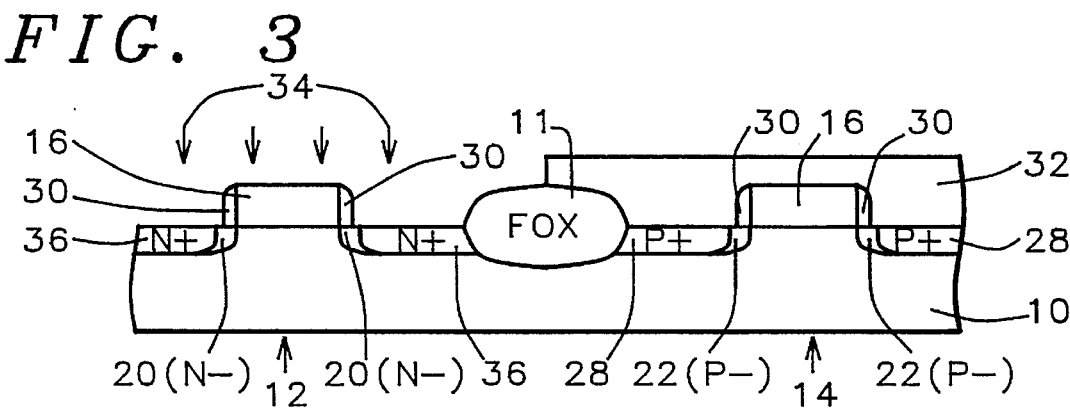

Referring to FIG. 4, a photoresist mask 32 is placed over the PMOS region 14. The N+ heavily doped source and drain implantation 34 is done with, for example, arsenic ions at a dose of between about 2 E 15 to 5 E 15 atoms/cm$^2$ and with an energy of between about 50 to 70 KeV to form N+ implanted regions 36. The photoresist mask 32 is removed. The integrated circuit is completed as is conventional in the art.

The process of the invention provides a simple process with a high NMOS driving current. The shorter NMOS spacer width provides a shorter effective channel length and, hence, a higher driving current. Reliable integrated circuit devices are produced without the need for extra deposition and cycle time.

While the invention has been particularly shown and described with reference to the preferred embodiments thereof, it will be understood by those skilled in the art that various changes in form and details may be made without departing from the spirit and scope of the invention.

What is claimed is:

1. A method of forming different width spacers for NMOS and PMOS in the fabrication of an integrated circuit comprising:

providing a semiconductor substrate wherein NMOS and PMOS regions are separated by an isolation region;

forming gate electrodes in said NMOS and PMOS regions;

implanting lightly doped regions into said semiconductor substrate within said NMOS and PMOS regions;

depositing a spacer material layer over said gate electrodes in said NMOS and PMOS regions and etching away said spacer material layer to leave spacers on the sidewalls of said gate electrodes;

covering said NMOS region with a photoresist mask;

implanting heavily doped source and drain regions into said semiconductor substrate within said PMOS region;

removing said photoresist mask;

after said implanting within said PMOS region, etching away a portion of said spacers to leave narrower spacers on the sidewalls of said gate electrodes;

covering said PMOS region with a photoresist mask;

implanting heavily doped source and drain regions into said semiconductor substrate within said NMOS region;

removing said photoresist mask; and completing the fabrication of said integrated circuit.

2. A method according to claim 1 wherein said gate electrodes are composed of polysilicon.

3. A method according to claim 1 wherein said lightly doped regions within said NMOS regions are formed by implanting phosphorus ions with a dosage of between about 8 E 12 to 6 E 13 atoms/cm$^2$ at an energy of between about 25 to 40 KeV.

4. A method according to claim 1 wherein said lightly doped regions within said NMOS regions are formed by implanting arsenic ions with a dosage of between about 8 E 12 to 6 E 13 atoms/cm$^2$ at an energy of between about 5 to 40 KeV.

5. A method according to claim 1 wherein said lightly doped regions within said PMOS regions are formed by implanting BF$_2$ ions with a dosage of between about 8 E 12 to 6 E 13 atoms/cm$^2$ at an energy of between about 20 to 40 KeV.

6. A method according to claim 1 wherein said spacer material layer comprises polysilicon and is deposited by LPCVD to a thickness of between about 1500 to 3000 Angstroms.

7. A method according to claim 1 wherein said spacer material layer comprises an oxide and is deposited by LPCVD to a thickness of between about 1500 to 3000 Angstroms.

8. A method according to claim 1 wherein said spacers before said PMOS implantation have a width of between about 1300 to 2500 Angstroms.

9. A method according to claim 1 wherein said heavily doped regions within said PMOS regions are formed by implanting BF$_2$ ions with a dosage of between about 1 E 15 to 3 E 15 atoms/cm$^2$ at an energy of between about 50 to 70 KeV.

10. A method according to claim 1 wherein said narrower spacers have a width of between about 1000 to 1700 Angstroms.

11. A method according to claim 1 wherein said heavily doped regions within said NMOS regions are formed by implanting arsenic ions with a dosage of between about 2 E 15 to 5 E 15 atoms/cm$^2$ at an energy of between about 50 to 70 KeV.

12. A method of forming different width spacers for NMOS and PMOS in the fabrication of an integrated circuit comprising:

providing a semiconductor substrate wherein NMOS and PMOS regions are separated by an isolation region;

providing a gate oxide layer over the surface of said semiconductor substrate;

depositing a layer of polysilicon overlying said gate oxide layer and patterning said polysilicon layer to form gate electrodes in said NMOS and PMOS regions;

implanting lightly doped regions into said semiconductor substrate within said NMOS and PMOS regions;

depositing a spacer material layer over said gate electrodes in said NMOS and PMOS regions and etching away said spacer material layer to leave spacers on the sidewalls of said gate electrodes;

covering said NMOS region with a photoresist mask;

implanting heavily doped source and drain regions into said semiconductor substrate within said PMOS region;

removing said photoresist mask;

after said implanting within said PMOS region, etching away a portion of said spacers to leave narrower spacers on the sidewalls of said gate electrodes;

covering said PMOS region with a photoresist mask;

implanting heavily doped source and drain regions into said semiconductor substrate within said NMOS region;

removing said photoresist mask; and completing the fabrication of said integrated circuit.

13. A method according to claim 12 wherein said lightly doped regions within said NMOS regions are formed by implanting phosphorus ions with a dosage of between about 8 E 12 to 6 E 13 atoms/cm$^2$ at an energy of between about 25 to 40 KeV.

14. A method according to claim 12 wherein said lightly doped regions within said NMOS regions are formed by implanting arsenic ions with a dosage of between about 8 E 12 to 6 E 13 atoms/cm$^2$ at an energy of between about 25 to 40 KeV.

15. A method according to claim 12 wherein said lightly doped regions within said PMOS regions are formed by implanting BF$_2$ ions with a dosage of between about 8 E 12 to 6 E 13 atoms/cm$^2$ at an energy of between about 20 to 40 KeV.

16. A method according to claim 12 wherein said spacer material layer comprises polysilicon and is deposited by LPCVD to a thickness of between about 1500 to 3000 Angstroms.

17. A method according to claim 12 wherein said spacer material layer comprises an oxide and is deposited by LPCVD to a thickness of between about 1500 to 3000 Angstroms.

18. A method according to claim 12 wherein said spacers before said PMOS implantation have a width of between about 1300 to 2500 Angstroms.

19. A method according to claim 12 wherein said heavily doped regions within said PMOS regions are formed by implanting BF$_2$ ions with a dosage of between about 1 E 15 to 3 E 15 atoms/cm$^2$ at an energy of between about 50 to 70 KeV.

20. A method according to claim 12 wherein said narrower spacers have a width of between about 1000 to 1700 Angstroms.

21. A method according to claim 12 wherein said heavily doped regions within said NMOS regions are formed by implanting arsenic ions with a dosage of between about 2 E 15 to 5 E 15 atoms/cm$^2$ at an energy of between about 50 to 70 KeV.

22. A method of forming different width spacers for NMOS and PMOS in the fabrication of an integrated circuit comprising:

providing a semiconductor substrate wherein NMOS and PMOS regions are separated by an isolation region;

forming gate electrodes in said NMOS and PMOS regions;

implanting lightly doped regions into said semiconductor substrate within said NMOS and PMOS regions;

depositing a spacer material layer over said gate electrodes in said NMOS and PMOS regions and etching away said spacer material layer to leave spacers on the sidewalls of said gate electrodes wherein said spacers have a width of between about 1500 to 3000 Angstroms;

covering said NMOS region with a photoresist mask;

implanting heavily doped source and drain regions into said semiconductor substrate within said PMOS region;

removing said photoresist mask;

after said implanting within said PMOS region, etching away a portion of said spacers to leave narrower spacers on the sidewalls of said gate electrodes wherein said narrower spacers have a width of between about 1000 to 1700 Angstroms;

covering said PMOS region with a photoresist mask;

implanting heavily doped source and drain regions into said semiconductor substrate within said NMOS region;

removing said photoresist mask; and completing the fabrication of said integrated circuit.

23. A method according to claim 22 wherein said spacer material layer comprises polysilicon and is deposited by LPCVD to a thickness of between about 1500 to 3000 Angstroms.

24. A method according to claim 22 wherein said spacer material layer comprises an oxide and is deposited by LPCVD to a thickness of between about 1500 to 3000 Angstroms.

* * * * *